United States Patent
Yang (10) Patent No.: US 8,497,507 B2
(45) Date of Patent: Jul. 30, 2013

(54) ARRAY SUBSTRATE FOR LIQUID CRYSTAL DISPLAY DEVICE AND METHOD OF FABRICATING THE SAME

(75) Inventor: Joon-Young Yang, Bucheon-si (KR)

(73) Assignee: LG Display Co., Ltd., Seoul (KR)

( * ) Notice: Subject to any disclaimer, the term of this patent is extended or adjusted under 35 U.S.C. 154(b) by 341 days.

(21) Appl. No.: 12/003,488

(22) Filed: Dec. 26, 2007

(65) Prior Publication Data

US 2008/0210942 A1 Sep. 4, 2008

(30) Foreign Application Priority Data

Dec. 26, 2006 (KR) ........................ 10-2006-0133795

(51) Int. Cl.
 *H01L 21/00* (2006.01)
(52) U.S. Cl.
 USPC .............. 257/59; 257/E29.202; 257/E29.182; 257/E29.151
(58) Field of Classification Search
 USPC .......................................................... 257/59
 See application file for complete search history.

(56) References Cited

U.S. PATENT DOCUMENTS

| 6,432,755 | B2 * | 8/2002 | Sung et al. | 438/158 |
| 6,900,856 | B2 * | 5/2005 | Kim et al. | 349/44 |
| 2006/0076562 | A1 * | 4/2006 | Lee et al. | 257/72 |

FOREIGN PATENT DOCUMENTS

| CN | 1716062 A | | 1/2006 |
| JP | 03187274 A | * | 12/1989 |
| JP | 406045354 A | * | 2/1994 |
| JP | 2002-341367 A | | 11/2002 |
| JP | 2006-165488 A | | 6/2006 |
| KR | 1020020074701 | | 10/2002 |
| KR | 1020020074702 | | 10/2002 |
| TW | 486825 | | 5/2002 |

* cited by examiner

Primary Examiner — Julio J Maldonado
Assistant Examiner — Mohammad Choudhry
(74) Attorney, Agent, or Firm — McKenna Long & Aldridge, LLP (57) ABSTRACT

An array substrate for a liquid crystal display device includes a gate line on a substrate; a gate insulating layer on the gate line; a data line crossing the gate line; a gate electrode connected to the gate line; an active layer on the gate insulating layer and overlapping the gate electrode; first and second ohmic contact layers on the active layer, the first and second ohmic contact layers spaced apart from each other by a first distance; first and second barrier patterns spaced apart from each other by the first distance and on the first and second ohmic contact layers, respectively. The active layer is exposed through the first and second barrier patterns; source and drain electrodes spaced apart from each other by a second distance greater than the first distance and on the first and second barrier patterns, respectively.

9 Claims, 10 Drawing Sheets

ARRAY SUBSTRATE FOR LIQUID CRYSTAL DISPLAY DEVICE AND METHOD OF FABRICATING THE SAME

The present application claims the benefit of Korean Patent Application No. 2006-0133795 filed in Korea on Dec. 26, 2006, which is hereby incorporated by reference for all purposes as if fully set forth herein.

BACKGROUND OF THE INVENTION

1. Field of the Invention

The present invention relates to a liquid crystal display (LCD) device and more particularly to an array substrate for the LCD device having a thin film transistor of improved properties and a method of fabricating the array substrate.

2. Discussion of the Related Art

The LCD device uses optical anisotropy and polarization properties of liquid crystal molecules to display images. The liquid crystal molecules have directional orientation characteristics resulting from their thin and long shape. An arrangement direction of the liquid crystal molecules can be controlled by applying an electrical field to them. By controlling the arrangement direction of the liquid crystal molecules, light can be refracted along the arrangement direction of the liquid crystal molecules to display images.

In particularly, an LCD devices including a thin film transistor (TFT) as a switching element, and referred to as an active matrix LCD (AM-LCD) device, is well suited for implementing high resolution displays and for displaying moving images. A LCD device that includes the TFT as the switching element may be referred to a TFT-LCD device.

Generally, the TFT-LCD device includes an array substrate on which a TFT and a pixel electrode are formed, a color filter substrate on which a color filter layer and a common electrode are formed, and a liquid crystal layer. The array substrate and the color filter layer face and are spaced apart from each other, and a liquid crystal layer interposed therebetween is driven by an electric field induced between the pixel and common electrode.

Figure 1:
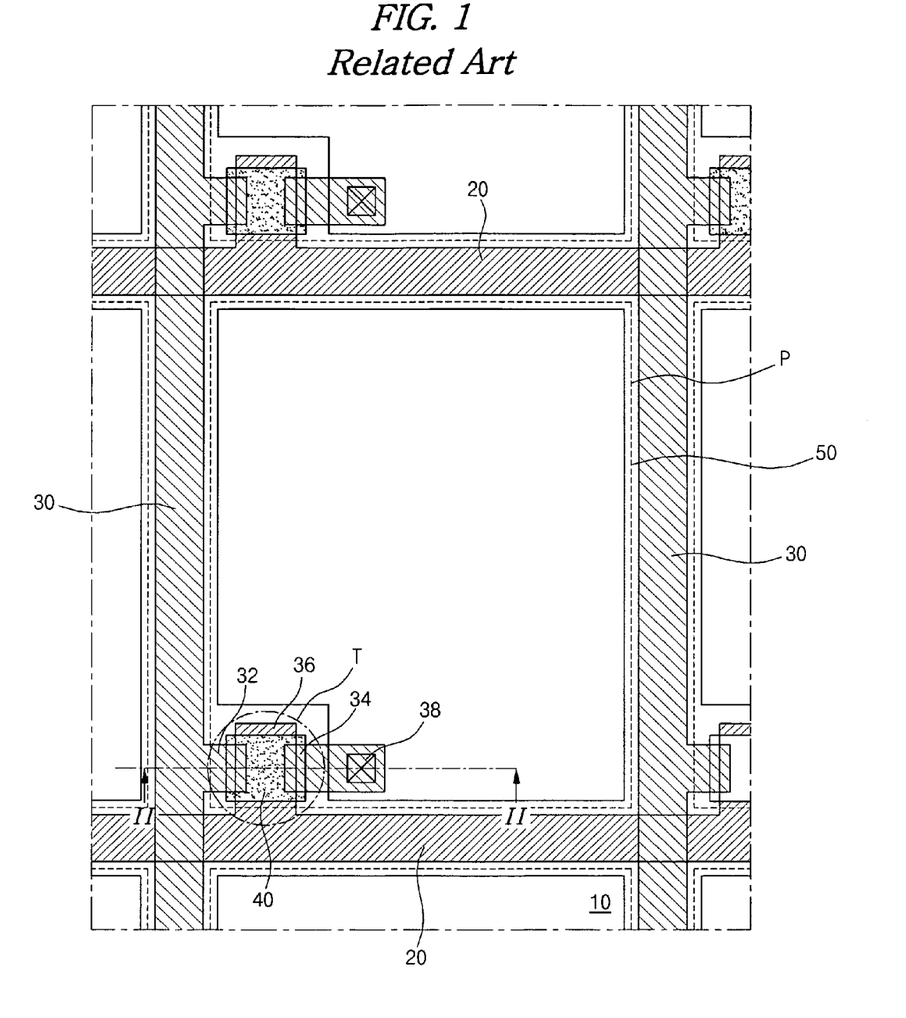
FIG. 1 is a perspective plan view showing a pixel region of an array substrate for an LCD device according to the related art.

FIG. 1 is a perspective plan view showing a pixel region of an array substrate for an LCD device according to the related art. In FIG. 1, a gate line 20, a gate electrode 36, an active layer 40, a source electrode 32 and a drain electrode 34, a data line 30, and a pixel electrode 50 are formed on a substrate 10 having a pixel region "P". The gate and data lines 20 and 30 cross each other to define the pixel region "P". The gate electrode 36 is connected to the gate line 20, and the active layer 40 is formed over the gate electrode 36. The source electrode 32 is connected to the data line 30 and spaced apart from the drain electrode 34. The gate electrode 36, the active layer 40, an ohmic contact layer (not shown), the source electrode 32 and the drain electrode 34 constitute a thin film transistor (TFT) "T". Moreover, the pixel electrode 50 is formed in the pixel region "P" to be connected to the drain electrode 34 through a drain contact hole 38. An exposed portion of the active layer 40 between the source and drain electrodes 32 and 34 is defined as a channel region. Properties of the TFT "T" depend on the geometry of the channel region.

FIGS. 2A to 2D are cross-sectional views showing fabricating processes of a portion of the array substrate taken along the line II-II of FIG. 1. A switching region "S" is defined in the pixel region "P" and the TFT "T" is formed in the switching region "S".

Figure 2A:
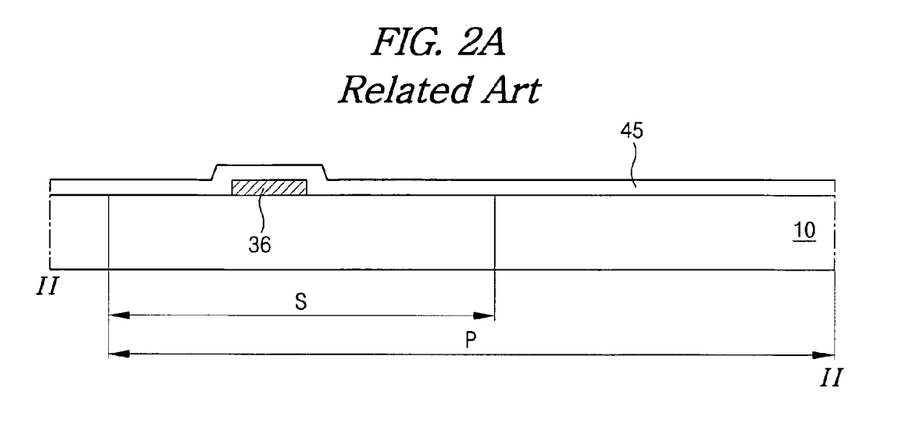
FIGS. 2A to 2D are cross-sectional views showing fabricating processes of a portion of the array substrate of FIG. 1 taken along the line II-II of FIG. 1.

As shown in FIG. 2A, a first metal layer (not shown) is formed on a substrate 10 and patterned through a first mask process to form a gate line (not shown) and a gate electrode 36. The gate electrode 36 is disposed in the switching region "S". A gate insulating layer 45 is formed on the substrate 10 including the gate line (not shown) and the gate electrode 36 by depositing an inorganic insulating material, such as silicon nitride (SiNe) and silicon oxide ($SiO_2$).

Figure 2B:
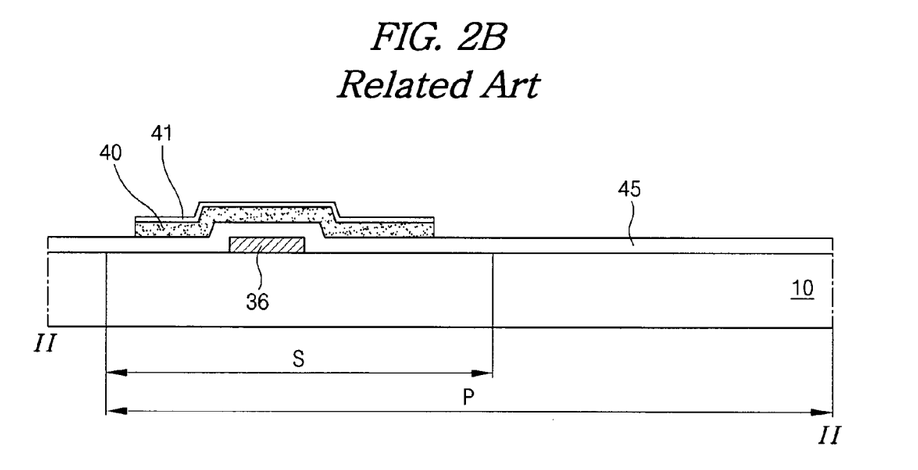

Next, as shown in FIG. 2B, an intrinsic amorphous silicon layer (not shown) and an impurity-doped amorphous silicon layer (not shown) are sequentially formed on the gate insulating layer 45. The intrinsic amorphous silicon layer (not shown) and the impurity-doped amorphous silicon layer (not shown) are patterned through a second mask process to form an active layer 40 and an impurity-doped amorphous silicon pattern 41. The impurity-doped amorphous silicon pattern 41 is disposed on the active layer 40, and both the active layer 40 and the impurity-doped amorphous silicon pattern 41 have an island shape and overlap to the gate electrode 36. The active layer 40 and the impurity-doped amorphous silicon pattern 41 are located in the switching region "S".

Figure 2C:
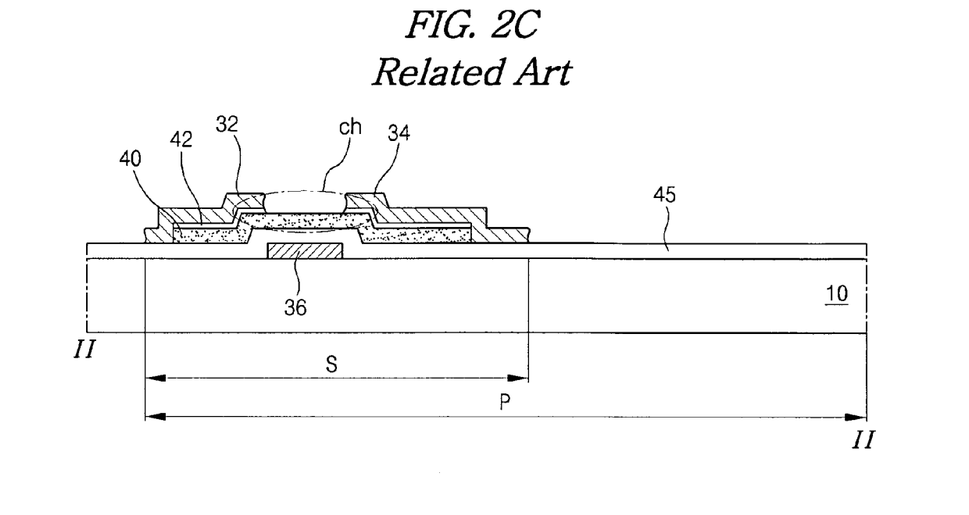

As shown in FIG. 2C, a second metal layer (not shown) is formed on the substrate 10 on which the active layer 40 and the impurity-doped amorphous silicon pattern 41 (of FIG. 2B) are formed by depositing a conductive metallic material such as copper (Cu), aluminum (Al), or Al alloy (AlNd). The second metal layer is patterned through a third mask process to form a data line (not shown), a source electrode 32 and a drain electrode 34. The data line crosses the gate line to define the pixel region "P", and the source electrode 32 is connected to the data line. The source and drain electrodes 32 and 34 are spaced apart from each other and located in the switching region "S". A portion of the impurity-doped amorphous silicon pattern 41 and the active layer 40 between the source and drain electrodes 32 and 34 may correspond to a center of the gate electrode 36. The impurity-doped amorphous silicon pattern 41 (of FIG. 2B) exposed between the source and drain electrodes 32 and 34 is removed using the source and drain electrodes 32 and 34 as a mask to form an ohmic contact layer 42 from the impurity-doped amorphous silicon pattern 41 (of FIG. 2B) exposing a portion of the active layer 40. The exposed portion of the active layer 40 is defined as a channel region "ch".

Figure 2D:
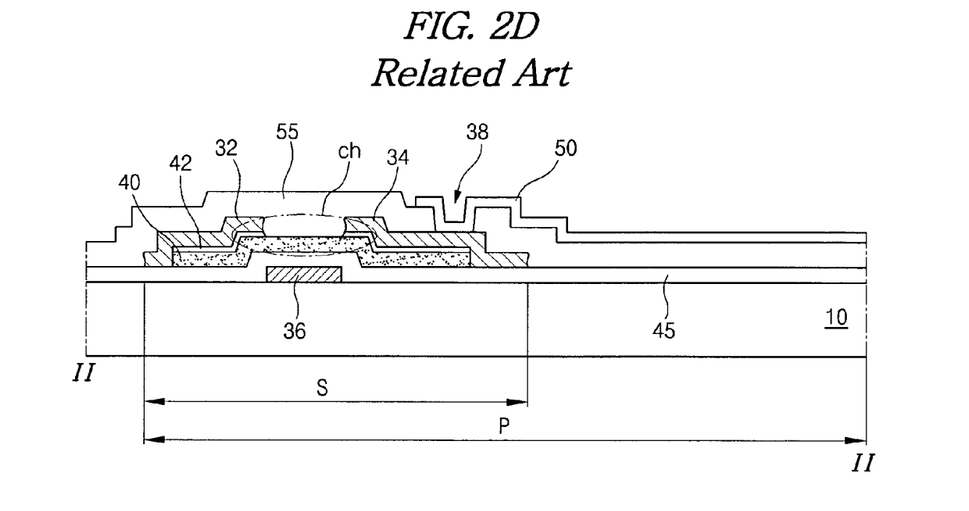

As shown in FIG. 2D, a passivation layer 55 is formed on the source and drain electrodes 32 and 34 by depositing an inorganic insulating material, such as silicon nitride (SiNe) and silicon oxide ($SiO_2$), and then patterned through a fourth mask process to form a drain contact hole 38 exposing a portion of the drain electrode 34. A transparent conductive material layer (not shown) is formed on the passivation layer 55 by depositing a transparent conductive material such as indium-tin-oxide (ITO) and indium-zinc-oxide (IZO), and then patterned through a fifth mask process to form a pixel electrode 50. The pixel electrode 50 is connected to the drain electrode 34 through the drain contact hole 38.

In the third mask process, the second metal layer (not shown) including one of Cu, Al and AlNd is wet-etched. During the wet-etching process, the second metal layer may be over-etched resulting in variation of the width; a critical dimension (CD) of the channel region "ch". The width of the channel region, which is a distance between the source and drain electrodes, may vary from the desired value such that properties and of the TFT are degraded.

With reference to FIGS. 3A to 3D, the third mask process is explained in more detail. FIGS. 3A to 3D show details of the third mask process illustrated in FIG. 2C.

Figure 3A:
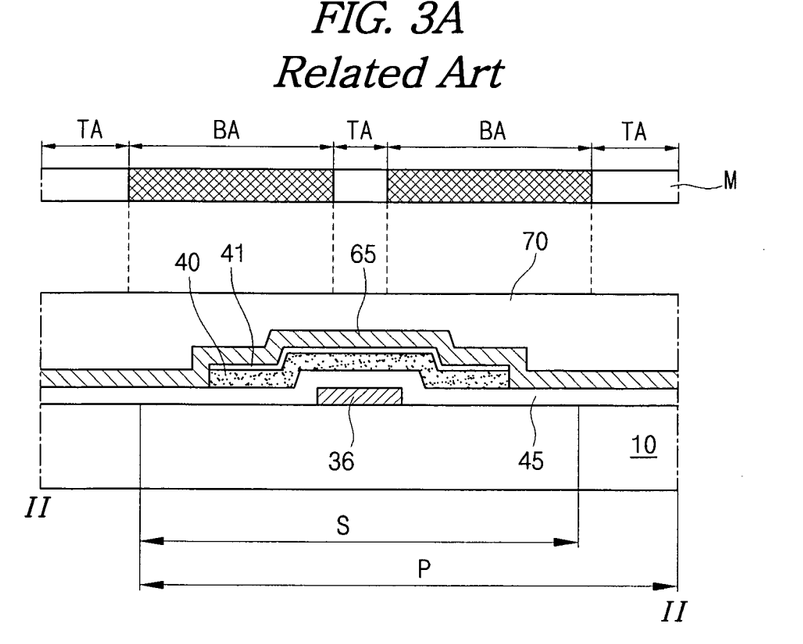
FIGS. 3A to 3D show details of the third mask process in FIG. 2C.

In FIG. 3A, the second metal layer 65 and a photosensitive material layer 70 are sequentially formed on the substrate 10 where the gate electrode 36, the gate insulating layer 45, the active layer 40 and the impurity-doped amorphous silicon pattern 41 are formed. The photosensitive material layer 70 may be a positive type in which an unexposed portion of the photosensitive material layer 70 is not developed (i.e., the unexposed portions are not removed developing). The mask "M" including a transmitting area "TA" and a blocking area "BA" is disposed over the photosensitive material layer 70. The transmitting area "TA" has a transmittance of about 100%, while the blocking area "BA" has a transmittance of about 0%. The blocking area "BA" corresponds to both end portions of the active layer 40, and the transmitting area "TA" is located between the blocking areas "BA". In particular, the transmitting area "TA" corresponds to the gate electrode 36. Further, the blocking area "BA" corresponds to a portion where the second metal layer 65 is to remain. The photosensitive material layer 70 is exposed through the mask "M", and thereby being developed.

Figure 3B:
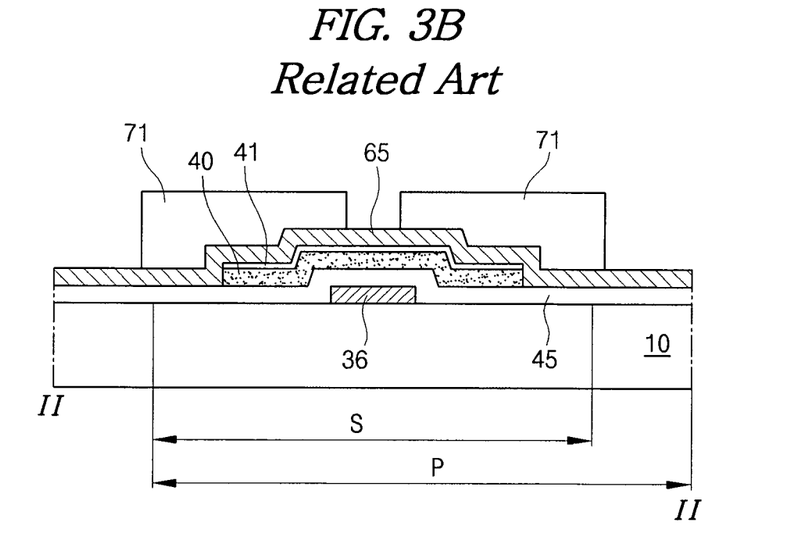

As shown in FIG. 3B, the photosensitive material layer 70 (of FIG. 3A) corresponding to the transmitting area "TA" is removed to expose the second metal layer 65, while the photosensitive material layer 70 (of FIG. 3A) corresponding to the blocking area "BA" remains to form photosensitive material patterns 71 on the second metal layer 65.

Figure 3C:
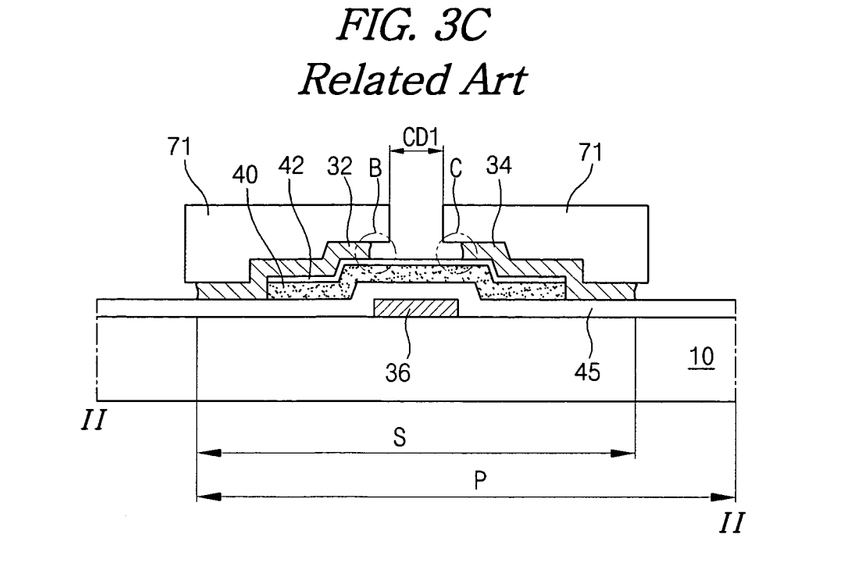

Next, as shown in FIG. 3C, the second metal layer 65 (of FIG. 3B) is etched using the photosensitive material patterns 71 as an etching mask to form the source and drain electrodes 32 and 34 and to expose the impurity-doped amorphous silicon pattern 41. When the second metal layer 65 (of FIG. 3B) includes at least one of Cu, Al and AlNd, the second metal layer 65 (of FIG. 3B) is wet-etched. During wet-etching, the side portions B and C of the source and drain electrodes 32 and 34 are exposed to an etchant and become over-etched. Accordingly, a distance between the source and drain electrodes 32 and 34 is greater than a desired critical dimension "CD1". That is, the distance between the source and drain electrodes 32 and 34 is greater than the distance between photosensitive material patterns 71.

Figure 3D:
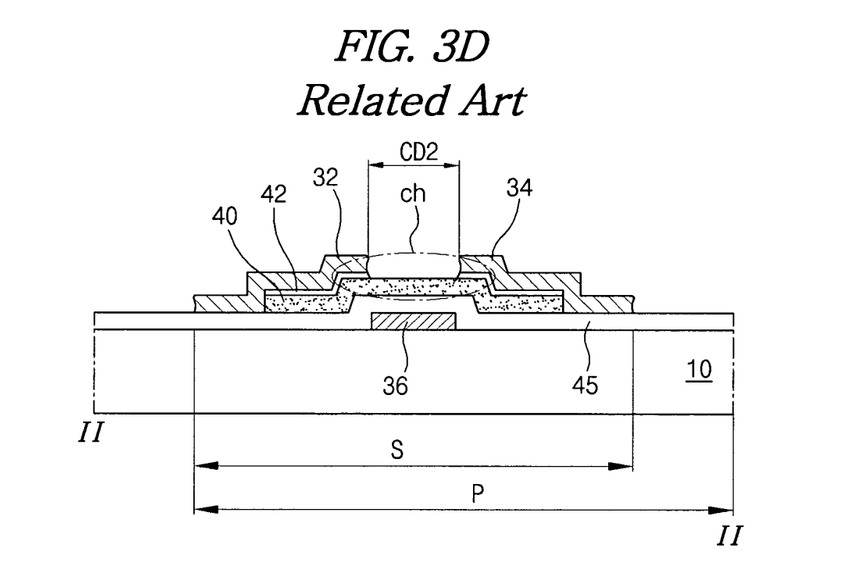

Next, as shown in FIG. 3D, the exposed impurity-doped amorphous silicon pattern 41 (of FIG. 3C) is etched using the source and drain electrodes 32 and 34 to form the ohmic contact layer 42 from the impurity-doped amorphous silicon pattern 41 (of FIG. 3C) and expose the active layer 40. As mentioned above, the exposed active layer 40 is defined as the channel region "ch". Since the distance between the source and drain electrodes 32 and 34 is greater than the desired critical dimension "CD1", a width of the channel region "CD2" is also greater than the desired critical dimension "CD1".

Typically, the desired critical dimension "CD1" is about 5 micrometers (μm), while the width of the channel region "CD2" is about 9 μm. The increased width of the channel region causes a deterioration of the properties of the TFT. Moreover, when fabricating an array substrate for the LCD device including an in-plane switching (IPS) mode, a decreased width of lines may cause problems such as a signal delay.

SUMMARY OF THE INVENTION

Accordingly, the present invention is directed to an array substrate for an LCD device and a method of fabricating the same that substantially obviates one or more of the problems due to limitations and disadvantages of the related art.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described herein, an array substrate for a liquid crystal display device includes a gate line on a substrate; a gate insulating layer on the gate line; a data line crossing the gate line; a gate electrode connected to the gate line; an active layer on the gate insulating layer and overlapping the gate electrode; first and second ohmic contact layers on the active layer, the first and second ohmic contact layers spaced apart from each other by a first distance; first and second barrier patterns spaced apart from each other by the first distance and on the first and second ohmic contact layers, respectively, wherein the active layer is exposed through the first and second barrier patterns; source and drain electrodes spaced apart from each other by a second distance greater than the first distance and on the first and second barrier patterns, respectively, the source electrode being connected to the data line; and a pixel electrode connected to the drain electrode.

In another aspect of the present invention, a method of fabricating an array substrate for a liquid crystal display device comprises forming a gate line and a gate electrode on a substrate, the gate electrode connected to the gate line; forming a gate insulating layer on the gate electrode and the gate line; forming an active layer on the gate insulating layer, an impurity-doped amorphous silicon pattern on the active layer and a metal pattern on the impurity-doped amorphous silicon pattern on the active layer, each of the active layer, the impurity-doped amorphous silicon pattern and the metal pattern overlapping the gate electrode; forming a source electrode, a drain electrode and a data line, the source and drain electrodes on the metal pattern and spaced apart from each other by a first distance, the data line crossing the gate line and connected to the source electrode; etching the metal pattern and the impurity-doped amorphous silicon pattern to form first and second barrier patterns under the source and drain electrodes and first and second ohmic contact layers under the first and second barrier patterns, wherein the first barrier pattern and the first ohmic contact pattern are spaced apart from the second barrier pattern and the second ohmic contact pattern by a second distance smaller than the first distance; and forming a pixel electrode connected to the drain electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to an embodiment of the present invention, an example of which is illustrated in the accompanying drawings.

Figure 4:
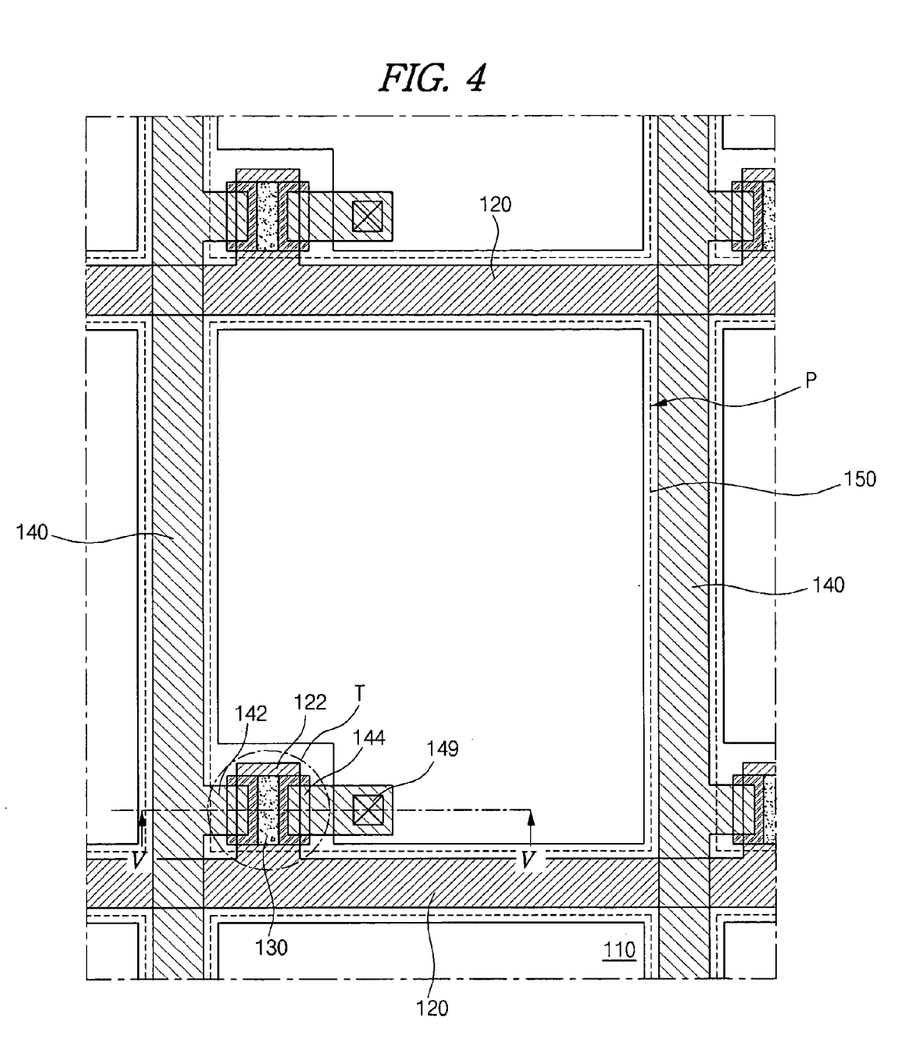
FIG. 4 is a plan view showing a pixel region of an array substrate for an LCD device according to the present invention.

FIG. 4 is a plan view showing a pixel region of an array substrate for an LCD device according to the present invention. In FIG. 4, a gate line 120, a gate electrode 122, a semiconductor layer (not shown) having an active layer 130 and ohmic contact layers (not shown), a source electrode 142 and a drain electrode 144, a data line 140, barrier patterns 136 and a pixel electrode 50 are formed on a substrate 110 having a pixel region "P". The gate and data lines 120 and 140 cross each other to define the pixel region "P". The gate electrode 122 is connected to the gate line 20, and the active layer 130 is formed over the gate electrode 122. The source electrode 142 is connected to the data line 140 and spaced apart from the drain electrode 144. The gate electrode 122, the active layer 130, the ohmic contact layers (not shown), the source electrode 142 and the drain electrode 144 constitute a thin film transistor (TFT) "T". Moreover, the pixel electrode 150 is formed in the pixel region "P" to be connected to the drain electrode 144 through a drain contact hole 149. The barrier patterns 136 are disposed over the active layer 130 and under the source and drain electrodes 142 and 144. A distance between the barrier patterns 136 is less than that between the source and drain electrodes 142 and 144. Each of the source and drain electrodes 142 and 144 includes at least one of copper (Cu), copper-titanium alloy (Cu—Ti), aluminum (Al) and Al alloy (AlNd). The barrier patterns 136 include at least one of molybdenum (Mo) and molybdenum-titanium alloy (MoTi). An exposed portion of the active layer 130 between the barrier patterns 136 defines a channel region. Properties of the TFT "T" depend on the geometry of the channel region.

FIGS. 5A to 5H are cross-sectional views showing fabricating processes of a portion taken along the line V-V of FIG. 4. In the present invention, the barrier patterns are formed under the source drain electrodes. The barrier patterns are formed of a barrier metallic material that is not reactive with an etchant for etching the source and drain electrodes. Accordingly, even if the source and drain electrodes are over-etched, the width of the channel region has a desired critical dimension. As a result, degradation of the TFT properties can be reduced or eliminated.

Figure 5A:
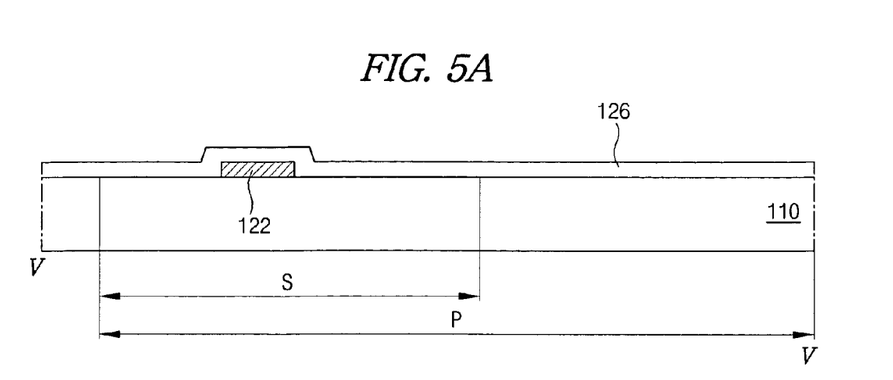
FIGS. 5A to 5H are cross-sectional views showing fabricating processes of a portion taken along the line V-V of the array substrate shown in FIG. 4.

FIG. 5A shows a first mask process. In FIG. 5A, a first metal layer is formed on a substrate 110 and patterned through the first mask process to form a gate line (not shown) and a gate electrode 122. A switching region "S" is defined in a pixel region "P". In the switching region "S", the TFT "T" is formed. The gate electrode 122 is disposed in the switching region "S". A gate insulating layer 126 is formed on the substrate 110 including the gate line (not shown) and the gate electrode 122 by depositing an inorganic insulating material, such as silicon nitride ($SiN_x$) and silicon oxide ($SiO_2$).

Figure 5B:
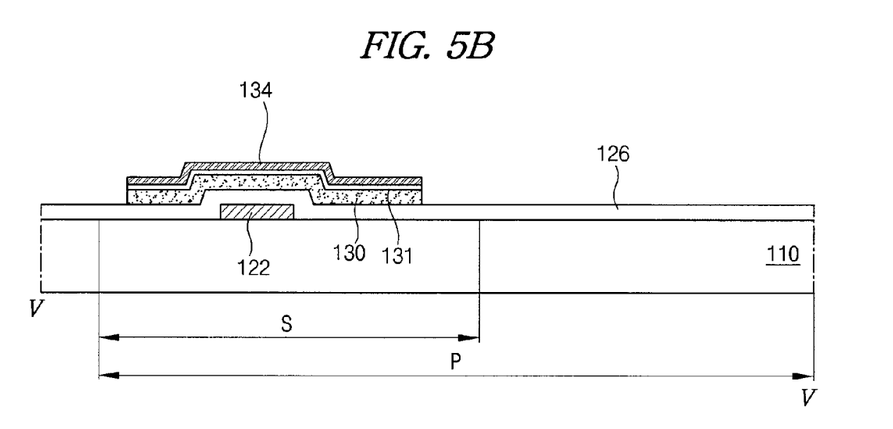

FIG. 5B shows a second mask process. As shown in FIG. 5B, an intrinsic amorphous silicon layer, an impurity-doped amorphous silicon layer, and a second metal layer are sequentially formed on the gate insulating layer 126. The second metal layer includes at least one of Mo and MoTi. The second metal layer is not etched by an etchant for etching the source and drain electrodes but is capable of being dry-etched. The intrinsic amorphous silicon layer, the impurity-doped amorphous silicon layer and the second metal layer are patterned through a second mask process to form a laminated structure of an active layer 130, an impurity-doped amorphous silicon pattern 131 and a metal pattern 134. The active layer 130 is disposed on the gate insulating layer 126 and overlaps the gate electrodes 122. The impurity-doped amorphous silicon pattern 131 is disposed on the active layer 130, and the metal pattern 134 is disposed on the impurity-doped amorphous silicon pattern 131. Each of the active layer 130, the impurity-doped amorphous silicon pattern 131 and the metal pattern 134 has an island shape and is disposed in the switching region "S".

Figure 5C:
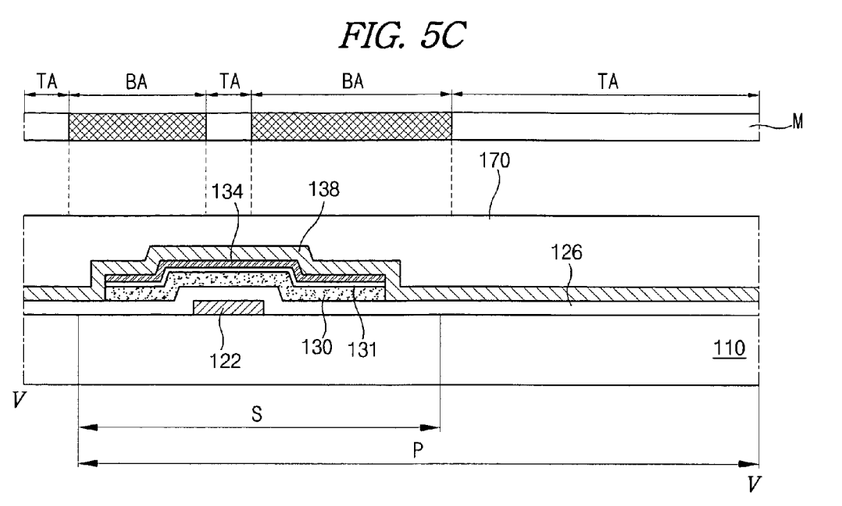

FIGS. 5C to 5G show a third mask process. In FIG. 5C, a third metal layer 138 is formed on an entire substrate 110 including the gate insulating layer 126, the active layer 130, the impurity-doped amorphous silicon pattern 131 and the metal pattern 134 by depositing at least one of Cu, CuTi, Al and AlNd. In particular, when the third metal layer 138 is formed of Cu, the third metal layer 138 has a double-layered structure including materials other than Cu to prevent deterioration and diffusion from the Cu metal layer. A photosensitive material layer 170 is formed on the third metal layer 138, and a mask "M" having a transmitting area "TA" and a blocking area "BA" is disposed over the photosensitive material layer 170. The photosensitive material layer 170 may include positive type photoresist material for which unexposed portions of the photosensitive material layer 170 are not developed. Alternatively, the photosensitive material layer 170 may be a negative type. The transmitting area "TA" has a transmittance of about 100%, while the blocking area "BA" has a transmittance of about 0%. The blocking area "BA" corresponds to both end portions of the active layer 130, and the transmitting area "TA" is located between portions of the blocking area "BA". In other words, the transmitting area "TA" overlaps the gate electrode 122. Moreover, the blocking area "BA" corresponds to a portion where the third metal layer 138 is to remain, and corresponds to a portion of the array substrate in which a source electrode, a drain electrode and a data line are to be formed. The photosensitive material layer 170 is exposed through the mask "M", and thereby being developed.

Figure 5D:
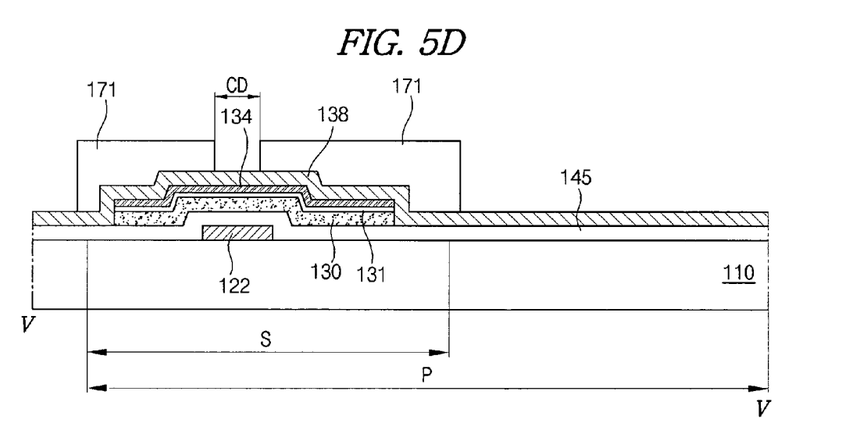

In FIG. 5D, the photosensitive material layer 170 (of FIG. 5C) corresponding to the transmitting area "TA" (of FIG. 5C) is removed to expose the third metal layer 138, while the photosensitive material layer 170 (of FIG. 5C) corresponding to the blocking area "BA" remains to form photosensitive material patterns 171 on the third metal layer 138. A portion between the photosensitive material patterns 171 corresponds to the gate electrode 122, and one of the photosensitive material patterns 171 is spaced apart from the other of the photosensitive material patterns 171 by a desired critical dimension "CD".

Figure 5E:
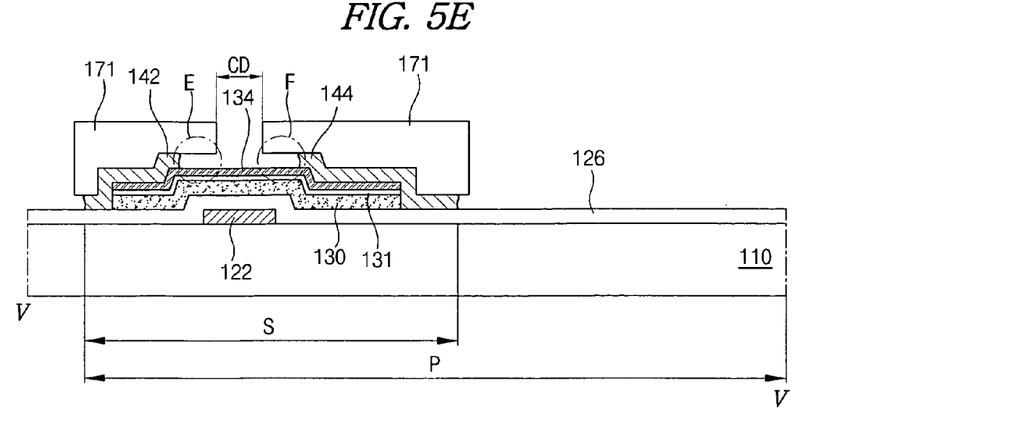

Next, as shown in FIG. 5E, the third metal layer 138 (of FIG. 5D) is wet-etched using the photosensitive material patterns 171 as an etching mask to form a source electrode 142 and a drain electrode 144 on the metal pattern 134. A data line crossing the gate line is formed at the same time. Because the wet-etching is isotropic, the third metal layer 138 (of FIG. 5D) may be over-etched at side portions "E" and "F". Accordingly, a distance between the source and drain electrodes 142 and 144 is greater than the desired critical dimension "CD". By etching the third metal layer (of FIG. 5D), the metal pattern 134 is exposed between the source and drain electrodes 142 and 144. The metal pattern 134 including at least one of Mo and MoTi is not etched by an etchant for etching the third metal layer 138 (of FIG. 5D). Accordingly, even if the third metal layer 138 (of FIG. 5D) is over-etched a width of the channel region is not affected.

Figure 5F:
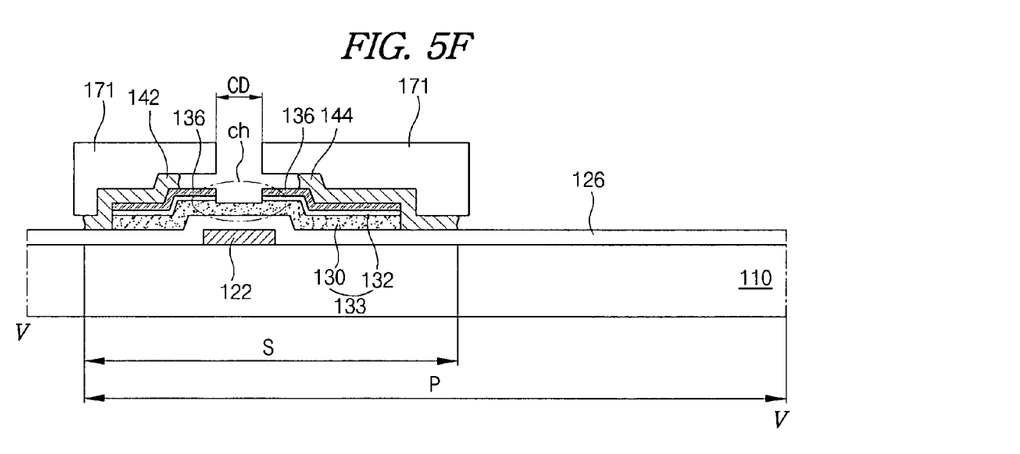

Next, as shown in FIG. 5F, the metal pattern 134 (of FIG. 5E) and the impurity-doped amorphous silicon pattern 131 (of FIG. 5E) are sequentially dry-etched using the photosensitive material patterns 171 to form barrier patterns 136 and ohmic contact layers 132. The dry-etching is an anisotropic process. The ohmic contact layers 132 on the active layer 130 and the active layer constitute a semiconductor layer 133, and the barrier patterns 136 are disposed on the ohmic contact layers 132. Since the barrier patterns 136 are formed of a conductive material, the source and drain electrodes 142 and 144 respectively have an improved ohmic contact with the ohmic contact layers due to the barrier patterns 136. One of the ohmic contact layers 132 and the other one of the ohmic contact layers 132 are respectively disposed at side portions of the active layer 130 such that a center portion of the active layer that overlaps the gate electrode 122, is exposed between the ohmic contact layers 132. The exposed portion of the active layer 130 is defined as the channel region "ch". The barrier patterns 136 substantially perfectly overlap respective ones of the ohmic contact layers 132. That is the barrier patterns 136 have substantially the same shape as the ohmic layers 132, and the edges defining each of the barrier patterns 132 correspond to the edges defining respective ones of the ohmic layers 132. Because the barrier patterns 136 and the ohmic contact layers 132 are formed using anisotropic dry-etching, a width of the channel region "ch" of the TFT corresponds to the desired critical dimension "CD". In other words, a distance between the barrier patterns 136 is smaller than the distance between the source and drain electrodes 142 and 144, and the width of the channel region "ch" depends on the distance between the barrier patterns 136, rather than on the distance between the source and drain electrodes 142 and 144.

Figure 5G:
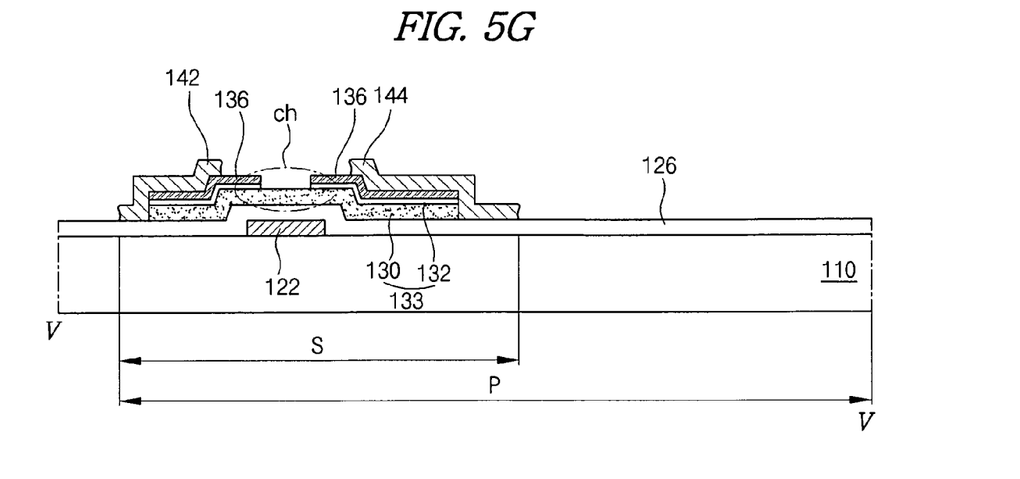

Next, as shown in FIG. 5G, the photosensitive material patterns 171 is removed such that the source and drain electrodes 142 and 144 are exposed.

Figure 5H:
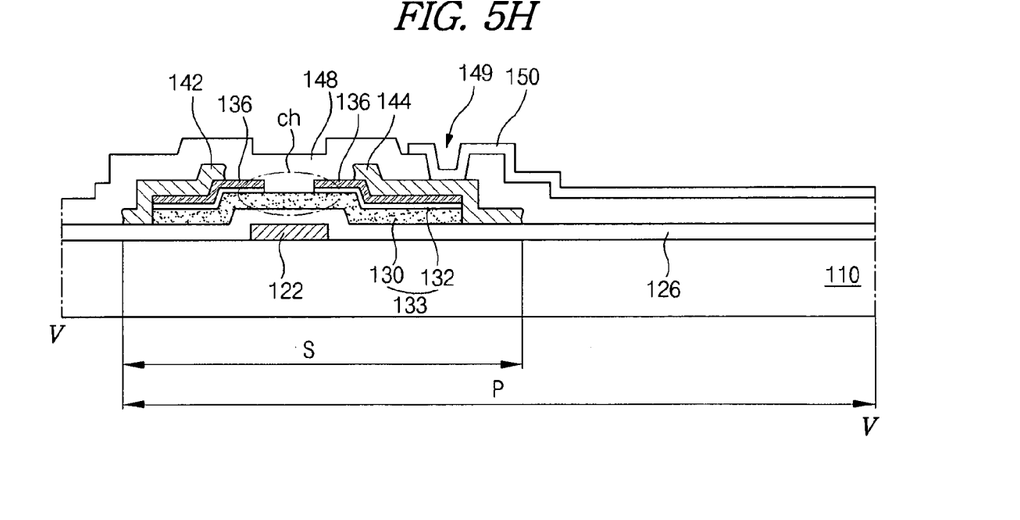

FIG. 5H shows fourth and fifth mask processes. As shown in FIG. 5H, a passivation layer 148 is formed on the source and drain electrodes 142 and 144 by depositing an inorganic insulating material, such as silicon nitride (SiNx) and silicon oxide (SiO2), and then the passivation layer 148 is patterned through the fourth mask process to form a drain contact hole 149. The drain contact hole 149 exposes a portion of the drain electrode 144. Next, a transparent conductive material layer is formed on the passivation layer 148 by depositing a transparent conductive material, such as indium-tin-oxide (ITO) and indium-zinc-oxide (IZO), and the transparent conductive material layer is patterned through the fifth mask process to form a pixel electrode 150 in the pixel region "P". The pixel electrode 150 is connected to the drain electrode 144 through the drain contact hole 149.

The array substrate for the LCD device is fabricated through the above-mentioned five mask processes. In the array substrate for the LCD device according to the present invention, barrier patterns that can be anisotropically dry-etched prevent variations of a width of the channel region. Because the barrier patterns are formed by anisotropic dry-etching after forming the source and drain electrodes by wet-etching, the width of the channel region depends on a distance between the barrier patterns. Accordingly, it is possible to obtain the width of the channel region of a desired critical dimension. As a result, properties of the thin film transistor (TFT) are improved.

The above-mentioned processes can be applied in four mask processes for fabricating an array substrate. In four mask processes, the semiconductor layer and the source and drain electrodes are formed through a single mask process.

Moreover, the above-mentioned fabricating process may also be applied to an array substrate for an IPS mode LCD device. Because the electrical lines of the array substrate, such as a gate line and a data line have the desired widths, signal delay problems may be reduced or eliminated.

It will be apparent to those skilled in the art that various modifications and variations can be made in the organic electroluminescent device and fabricating method thereof of the present invention without departing from the spirit or scope of the invention. Thus, it is intended that the present invention cover the modifications and variations of this invention provided they come within the scope of the appended claims and their equivalents.

What is claimed is:

1. An array substrate for a liquid crystal display device, comprising:
    a gate line on a substrate;
    a gate insulating layer on the gate line;
    a data line crossing the gate line;
    a gate electrode connected to the gate line;
    an active layer on the gate insulating layer and overlapping the gate electrode;
    first and second ohmic contact layers on the active layer, the first and second ohmic contact layers spaced apart from each other by a first distance;
    first and second barrier patterns spaced apart from each other by the first distance and on the first and second ohmic contact layers, respectively, wherein the active layer is exposed through the first distance between the first and second barrier patterns;
    source and drain electrodes spaced apart from each other by a second distance greater than the first distance and on the first and second barrier patterns, respectively, the source electrode being connected to the data line;
    a passivation layer on the substrate and directly contacting a top surface of the first and second barrier patterns, wherein the passivation layer includes a drain contact hole; and
    a pixel electrode on the passivation layer and connected to the drain electrode via the drain contact hole,
    wherein the first and second barrier patterns include at least one of molybdenum (Mo) and molybdenum-titanium alloy (MoTi).

2. The substrate according to claim 1, wherein the source and drain electrodes include at least one of copper (Cu), copper-titanium alloy (Cu—Ti), aluminum (Al) and Al alloy (AlNd).

3. The substrate according to claim 1, wherein each of the first ohmic contact layers, the first barrier pattern, and the source electrode is symmetric about a center line of the gate electrode to the second ohmic contact layer, the second barrier pattern, and the drain electrode, respectively.

4. The substrate according to claim 1, wherein the first and second barrier patterns define a space therebetween that corresponds with a space defined between the first and second ohmic contact layers.

5. A method of fabricating an array substrate for a liquid crystal display device, comprising:
    forming a gate line and a gate electrode on a substrate, the gate electrode connected to the gate line;
    forming a gate insulating layer on the gate electrode and the gate line;

forming an active layer on the gate insulating layer, an impurity-doped amorphous silicon pattern on the active layer and a metal pattern on the impurity-doped amorphous silicon pattern on the active layer, each of the active layer, the impurity-doped amorphous silicon pattern and the metal pattern overlapping the gate electrode;

forming a first metal layer on the metal pattern;

forming first and second photosensitive material patterns on the first metal layer and corresponding to the metal pattern, the first and second photosensitive material patterns spaced apart from each other by a first distance;

patterning the first metal layer using the first and second photosensitive material patterns as an etching mask to form a source electrode, a drain electrode and a data line, the source and drain electrodes on the metal pattern and spaced apart from each other by a second distance being greater than the first distance, the data line crossing the gate line and connected to the source electrode;

etching the metal pattern and the impurity-doped amorphous silicon pattern to form first and second barrier patterns from the metal pattern under the source and drain electrodes and first and second ohmic contact layers under the first and second barrier patterns, wherein the first barrier pattern and the first ohmic contact pattern are spaced apart from the second barrier pattern and the second ohmic contact pattern by the first distance;

forming a passivation layer on the substrate and directly contacting a top surface of the first and second barrier patterns, wherein the passivation layer includes a drain contain hole; and forming a pixel electrode on the passivation layer and connected to the drain electrode via the drain contact hole, wherein the metal pattern includes at least one of molybdenum (Mo) and molybdenum-titanium alloy (MoTi).

6. The method according to claim 5, wherein etching the metal pattern and the impurity-doped amorphous silicon pattern includes:

anisotropically dry-etching the metal pattern and the impurity-doped amorphous silicon pattern using the first and second photosensitive material patterns as an etching mask to expose the active layer; and removing the first and second photosensitive material patterns.

7. The method according to claim 5, wherein the source and drain electrodes include at least one of copper (Cu), copper-titanium alloy (Cu—Ti), aluminum (Al) and Al alloy (AlNd).

8. The method according to claim 5, wherein the first and second barrier patterns define a space therebetween that corresponds with a space defined between the first and second ohmic contact layers.

9. The method according to claim 5, wherein the first metal layer is patterned by a wet-etching using an etchant, and wherein the metal pattern is not etched by the etchant.

* * * * *